(12) United States Patent
Wang et al.

(10) Patent No.: US 11,316,128 B2
(45) Date of Patent: Apr. 26, 2022

(54) FLEXIBLE DISPLAY SUBSTRATE, DISPLAY PANEL AND DISPLAY DEVICE HAVING A CRACK STOPPING COMPONENT

(71) Applicants: Chengdu BOE Optoelectronics Technology Co., Ltd., Sichuan (CN); BOE Technology Group Co., Ltd., Beijing (CN)

(72) Inventors: Ge Wang, Beijing (CN); Zhiliang Jiang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 492 days.

(21) Appl. No.: 16/337,595

(22) PCT Filed: Oct. 8, 2018

(86) PCT No.: PCT/CN2018/109354
§ 371 (c)(1),
(2) Date: Mar. 28, 2019

(87) PCT Pub. No.: WO2019/114384
PCT Pub. Date: Jun. 20, 2019

(65) Prior Publication Data
US 2021/0328171 A1    Oct. 21, 2021

(30) Foreign Application Priority Data

Dec. 11, 2017    (CN) .......................... 201711307262.2

(51) Int. Cl.
*H01L 51/00* (2006.01)
*H01L 51/52* (2006.01)
(Continued)

(52) U.S. Cl.
CPC ........ *H01L 51/525* (2013.01); *H01L 51/0097* (2013.01); *H01L 23/562* (2013.01);
(Continued)

(58) Field of Classification Search
CPC ............... H01L 51/525; H01L 51/0097; H01L 2251/5338; H01L 23/562; H01L 2/3244; H01L 3/3258
See application file for complete search history.

(56) References Cited

U.S. PATENT DOCUMENTS 9,985,125 B1 *  5/2018  Sano ................... H01L 29/0615
10,319,308 B2 *  6/2019  Lee ....................... G09G 3/3291
(Continued)

FOREIGN PATENT DOCUMENTS

CN        106848107 A      6/2017
CN        106997930 A      8/2017
(Continued)

OTHER PUBLICATIONS

Office Action for 201711307262.2 dated Jul. 16, 2020.
ISR for PCT/CN2018/109354 dated Dec. 28, 2018.
Office Action for 201711307262.2 dated Sep. 19, 2018.

*Primary Examiner* — Ida M Soward
(74) *Attorney, Agent, or Firm* — Arent Fox LLP; Michael Fainberg

(57) ABSTRACT

A flexible display substrate includes a flexible substrate and an insulation layer on the flexible substrate. The flexible substrate includes a display area and a non-display area surrounding the display area. A crack stopping component is on the insulation layer in the non-display area, and configured to stop a crack in the non-display area from extending to the display area.

19 Claims, 5 Drawing Sheets

(51) Int. Cl.
*H01L 27/32* (2006.01)
*H01L 23/00* (2006.01)

(52) U.S. Cl.
CPC ...... *H01L 27/3244* (2013.01); *H01L 27/3258* (2013.01); *H01L 2251/5338* (2013.01)

(56) References Cited

U.S. PATENT DOCUMENTS

| | | | |
|---|---|---|---|
| 10,347,853 B2* | 7/2019 | Park | G06F 3/0446 |
| 10,431,771 B2* | 10/2019 | Park | H01L 27/323 |
| 10,439,165 B2* | 10/2019 | Kim | H01L 51/5253 |
| 10,642,390 B2* | 5/2020 | Lee | G06F 3/0443 |
| 2016/0005697 A1* | 1/2016 | Noh | H01L 23/585 |
| | | | 257/508 |
| 2016/0066409 A1* | 3/2016 | Kwon | H01L 27/3276 |
| | | | 174/254 |
| 2016/0270209 A1* | 9/2016 | Cho | H01L 51/0097 |
| 2016/0284770 A1* | 9/2016 | Kim | H01L 27/3223 |
| 2017/0250366 A1 | 8/2017 | Andou et al. | |
| 2018/0033998 A1* | 2/2018 | Kim | H01L 27/3246 |
| 2018/0123062 A1* | 5/2018 | Lee | B32B 3/30 |
| 2020/0020880 A1* | 1/2020 | Saida | H05B 33/02 |

FOREIGN PATENT DOCUMENTS

| | | |
|---|---|---|
| CN | 107134471 A | 9/2017 |
| CN | 206650080 A | 11/2017 |
| CN | 107464828 A | 12/2017 |
| CN | 107705710 A | 2/2018 |
| CN | 107863376 A | 3/2018 |
| CN | 207458945 U | 6/2018 |
| KR | 20170038984 A | 4/2017 |

* cited by examiner

FLEXIBLE DISPLAY SUBSTRATE, DISPLAY PANEL AND DISPLAY DEVICE HAVING A CRACK STOPPING COMPONENT

This application is a National Stage of International Application No. PCT/CN2018/109354, filed Oct. 8, 2018, which claims priority to Chinese Patent Application No. 201711307262.2, filed Dec. 11, 2017, both of which are hereby incorporated by reference in their entireties.

FIELD

This disclosure relates to the field of display technologies, and particularly to a flexible display substrate, a display panel and a display device.

BACKGROUND

At present, an Organic Light-Emitting Diode (OLED) device is considered as a flat panel display with greatest development potential, and is also considered as a display with a technology most likely to manufacture a flexible display device.

Where an existing flexible display substrate generally includes a flexible substrate with a display area, an OLED component positioned in the display area of the flexible substrate, and an encapsulation layer covering the OLED component; where the encapsulation layer generally includes a plurality of stacked organic layers and inorganic layers, and the inorganic layers function as barriers for proofing water and oxygen, and the organic layers function as planarization layers.

However, when the existing flexible display substrate is subjected to a cutting process, or is bent or curled during subsequent use, cracks are easily produced in an edge of the flexible display substrate due to stress concentration in the vicinity of a cut surface; and when the cracks extend to the display area, water and oxygen may enter the display area through the cracks, which will negatively affect a service life of the flexible display substrate.

SUMMARY

Embodiments of the disclosure provide following technical solutions.

A flexible display substrate, including a flexible substrate and an insulation layer on the flexible substrate, where the flexible substrate includes a display area and a non-display area surrounding the display area; where a crack stopping component is on the insulation layer in the non-display area, and configured to stop a crack in the non-display area from extending to the display area.

Optionally, the crack stopping component includes at least one stopper group, where each of the at least one stopper group includes a plurality of stoppers distributed at intervals along a circumferential direction of the display area.

Optionally, the crack stopping component is on one side, two sides or three sides of the display area, or is around the entire display area.

Optionally, when the crack stopping component includes at least two stopper groups, the at least two stopper groups are arranged in parallel along a direction from the display area to the non-display area.

Optionally, every two adjacent stopper groups in the at least two stopper groups include a first stopper group and a second stopper group; the first stopper group includes a plurality of first stoppers, and a first gap exists between every two adjacent first stoppers; the second stopper group includes a plurality of second stoppers, and a second gap exists between every two adjacent second stoppers; where the first gap and the second gap are arranged in a staggered manner.

Optionally, each of the first stoppers and the second stoppers is a cuboid or a wavy solid, and a length extension direction of the cuboid or the wavy solid is consistent with an arrangement direction of the first stoppers.

Optionally, the first stopper group further includes a third stopper in the first gap, and a length extension direction of the third stopper is perpendicular to a length extension direction of the first stoppers.

Optionally, the second stopper group further includes a fourth stopper in the second gap, and a length extension direction of the fourth stopper is perpendicular to a length extension direction of the second stoppers.

Optionally, a length extension direction of each stopper in each stopper group has an included angle with an arrangement direction of the plurality of stoppers in the stopper group.

Optionally, every two adjacent stopper groups in the at least two stopper groups include a third stopper group and a fourth stopper group; the third stopper group includes a plurality of fifth stoppers, and a length extension direction of each fifth stopper has an included angle with an arrangement direction of the plurality of fifth stoppers; and the fourth stopper group includes a plurality of sixth stoppers, and a length extension direction of each sixth stopper coincides with an arrangement direction of the plurality of sixth stoppers.

Optionally, the crack stopping component includes at least two stopper groups, and the at least two stopper groups are fabricated on a same layer as a gate metal layer, and/or, a source and drain metal layer.

Optionally, the insulation layer includes a buffer layer, a gate insulation layer, or, a source and drain insulation layer.

Optionally, the flexible display substrate further includes at least one annular blocking wall on a side of the crack stopping component away from the display area, and/or, at least one blocking dam on a side of the crack stopping component proximate to the display area.

Further, the embodiments of the disclosure further provide a display panel, which includes any flexible display substrate provided in the above technical solutions.

The embodiments of the disclosure further provide a display device, which includes the display panel provided in the above technical solutions.

DETAILED DESCRIPTION OF THE EMBODIMENTS

The technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those skilled in the art without any inventive effort shall fall into the scope of the disclosure.

The embodiments of the disclosure provide a flexible display substrate, a display panel and a display device. Here, both of the display panel and the display device include the flexible display substrate above, and the flexible display substrate above can solve the problem that water and oxygen enter an OLED component to negatively affect a service life of a flexible display substrate.

Figure 1:
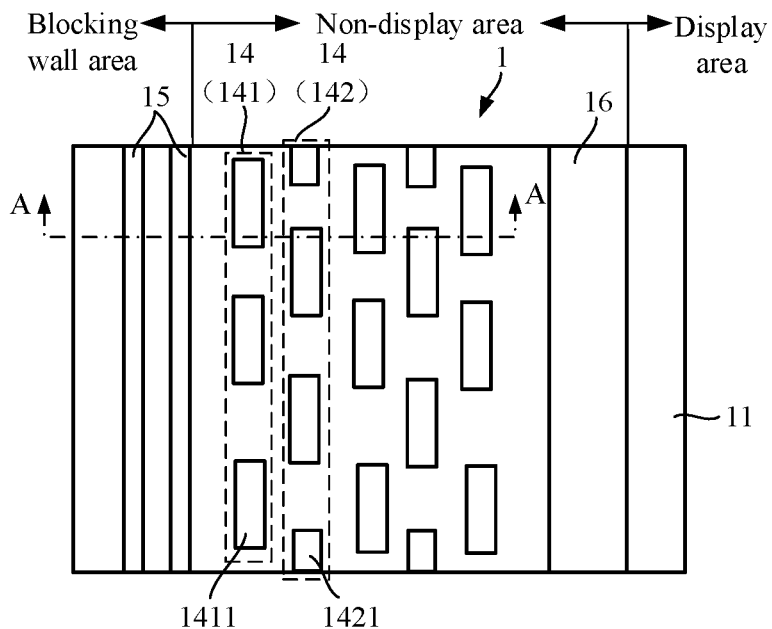
FIG. 1 is a partial structural diagram of a flexible display substrate according to the embodiments of the disclosure.
Figure 2:
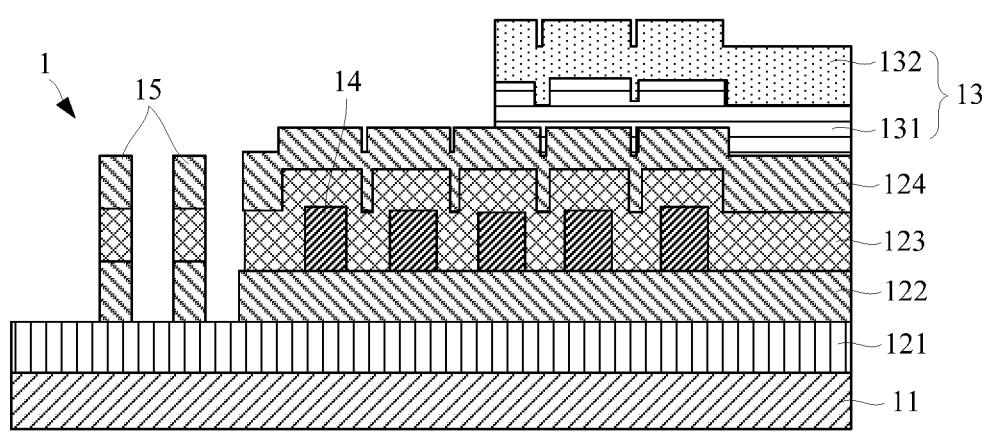
FIG. 2 is a sectional structural diagram of the flexible display substrate in FIG. 1 along an A-A direction.
Figure 3:
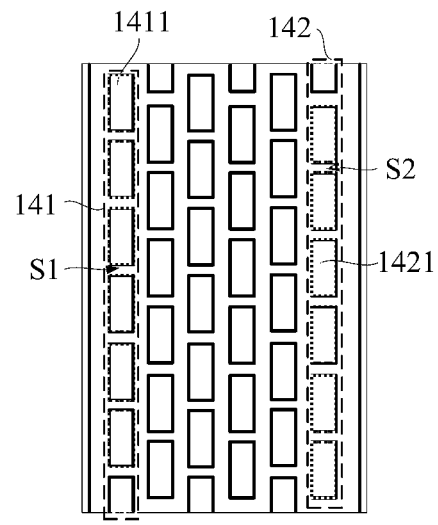
FIG. 3 is a structural diagram of a crack stopping component of a flexible display substrate according to the embodiments of the disclosure.

Where, as illustrated in FIG. 1, FIG. 2 and FIG. 3, the embodiments of the disclosure provide a flexible display substrate 1 including a flexible substrate 11, and, an insulation layer and an encapsulation layer 13 arranged in that order on the flexible substrate 11, where the flexible substrate 11 includes a display area and a non-display area surrounding the display area. As illustrated in FIG. 2, the flexible display substrate 1 includes the flexible substrate 11, a light emitting layer on a side of the flexible substrate 11, respective insulation layers at a peripheral area of the light emitting layer, and the encapsulation layer 13 configured to encapsulate the light emitting layer and the respective insulation layers. Further, a base substrate can be arranged between the flexible substrate 11 and the light emitting layer; the encapsulation layer 13 can include an inorganic layer and an organic layer (not illustrated in the figure); the respective insulation layers can include a buffer layer 121, a gate insulation layer and a source and drain insulation layer 124; the light emitting layer can be of an OLED structure; the gate insulation layer can include a first gate insulation layer 122 and a second gate insulation layer 123 arranged in a stacked manner; the encapsulation layer 13 can include a first encapsulation layer 131 and a second encapsulation layer 132 arranged in a stacked manner; and the first encapsulation layer 131 and the second encapsulation layer 132 can be inorganic encapsulation layers.

Figure 4:
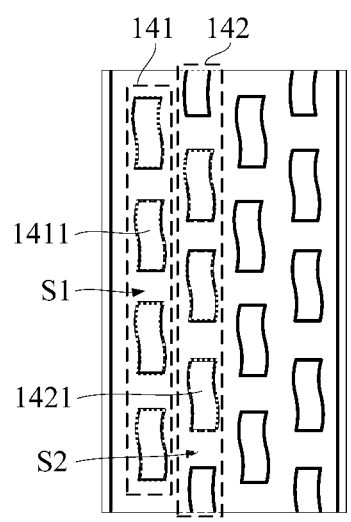
FIG. 4 is another structural diagram of a crack stopping component of a flexible display substrate according to the embodiments of the disclosure.

In the embodiments of the disclosure, the crack stopping component is on the buffer layer 121, the first gate insulation layer 122, the second gate insulation layer 123 or the source and drain insulation layer 124, corresponding to the non-display area, and the crack stopping component is configured to stop a crack in the non-display area from extending to the display area. As illustrated in FIG. 1 and FIG. 2, the crack stopping component is on the insulation layer in a peripheral area of the light emitting layer, the crack stopping component consists of at least one stopper group 14, and each stopper group 14 includes a plurality of stoppers distributed at intervals along a circumferential direction of the display area. For example, as illustrated in FIG. 1, a first stopper group 141 includes a plurality of first stoppers 1411 distributed at intervals along the circumferential direction of the display area, and a second stopper group 142 includes a plurality of second stoppers 1421 distributed at intervals along the circumferential direction of the display area. Further, as illustrated in FIG. 1, the crack stopping component can consist of five stopper groups 14 arranged in parallel along a direction from the display area to the non-display area; or the crack stopping component can consist of six stopper groups 14 arranged in parallel along the direction from the display area to the non-display area as illustrated in FIG. 3; or the crack stopping component can also consist of four stopper groups 14 arranged in parallel along the direction from the display area to the non-display area as illustrated in FIG. 4. Alike, the crack stopping component can also consist of one stopper group 14, two stopper groups 14, three stopper groups 14, seven stopper groups 14 or even more stopper groups 14, where each stopper group 14 includes a plurality of stoppers distributed at intervals along the circumferential direction of the display area, and a plurality of stopper groups 14 can form blocking walls arranged nested in multiple layers.

In a procedure of using the flexible display substrate 1, in case of a crack is produced in the non-display area of the flexible display substrate 1, since the crack stopping component is on the insulation layer, corresponding to the non-display area, of the flexible display substrate 1, when the crack produced in an edge of the non-display area by the flexible substrate 11 or the insulation layer extends to the crack stopping component, the crack cannot pass through the crack stopping component to extend further. Therefore, by adopting the crack stopping component, the flexible display substrate 1 can stop the crack of the non-display area from extending to the display area and can limit the crack in the non-display area, thus external water and oxygen can be stopped from entering the display area through the crack, and strength of the non-display area of the flexible display substrate 1 can also be strengthened through the crack stopping component. Therefore, in the flexible display substrate 1, the crack produced in the non-display area can be limited in the non-display area by the crack stopping component, and thereby cannot extend to the display area.

Thus, with the crack stopping component, the flexible display substrate 1 above can address the problem that water and oxygen enter the OLED component to negatively affect a service life of a flexible display substrate.

In a particular implementation, as illustrated in FIG. 2 to FIG. 9, the crack stopping component can include at least one stopper group 14, where each stopper group 14 includes a plurality of stoppers distributed at intervals along the circumferential direction of the display area. As illustrated in FIG. 2, the crack stopping component includes five stopper groups 14 arranged in parallel along a direction from the display area to the non-display area, and gaps exist between adjacent stoppers in each stopper group 14, so that the plurality of stoppers form a separated structure, and stress in each direction surrounding the display area of the flexible display substrate 1 can be dispersed to prevent a crack from occurring due to a phenomenon of stress concentration, thereby facilitating bending of the flexible display substrate 1 in each direction. Further, as illustrated in FIG. 3, the crack stopping component of the flexible display substrate 1 includes six stopper groups 14 arranged in parallel, while the crack stopping component in each of FIG. 4, FIG. 5, FIG. 6, FIG. 7, FIG. 8 and FIG. 9 includes four stopper groups 14. However, the crack stopping component does not have a limited number of stopper groups 14 as illustrated in FIG. 1 to FIG. 9, and can also consist of one stopper group 14, two stopper groups 14, or more stopper groups 14 such as three stopper groups 14 and seven stopper groups 14. And when the crack stopping component includes a plurality of stopper groups 14, the plurality of stopper groups 14 can form blocking walls arranged nested in multiple layers, and the arrangement of the plurality of stopper groups 14 can enhance the bending resistance of the flexible display substrate 1 in the non-display area and can also stop the crack produced in the peripheral area of the flexible display substrate 1 or the crack produced in the non-display area of the flexible display substrate 1 from extending to the display area.

In a particular implementation, the crack stopping component is in one side edge of the display area only, or is surrounding two or three side edges of the display area, or is surrounding the entire display area; where the specific design can be determined according to an actual demand.

In a particular implementation, in order to improve a crack extension stopping effect of the crack stopping component, as illustrated in FIG. 1, FIG. 3 and FIG. 4, every two adjacent stopper groups 14 in at least two stopper groups 14 include a first stopper group 141 and a second stopper group 142; where the first stopper group 141 includes a plurality of first stoppers 1411, and a first gap S1 exists between every two adjacent first stoppers 1411; the second stopper group 142 includes a plurality of second stoppers 1421, and a second gap S2 exists between every two adjacent second stoppers 1421; and the first gap S1 and the second gap S2 are arranged in a staggered manner.

As illustrated in FIG. 3 and FIG. 4, in every two adjacent stopper groups 14, the first gaps S1 between adjacent first stoppers 1411 in the first stopper group 141 and the second gaps S2 between adjacent second stoppers 1421 in the second stopper group 142 are arranged in the staggered manner; when the crack is produced in the edge of the flexible display substrate 1 and extends to the display area, the crack may continue extending to the second stoppers 1421 when extending to the first gaps S1 between the first stoppers 1411, and in such case, since the flexible display substrate 1 is structurally strengthened by the second stoppers 1421 opposite to the first gaps S1, the crack can be stopped by the second stoppers 1421 to thereby avoid it from further extending to the display area. Therefore, with the plurality of stopper groups 14 arranged in the staggered manner, the flexible display substrate 1 can be structurally strengthened, and the crack stopping effect of the crack stopping component is improved.

As illustrated in FIG. 1 and FIG. 3, each of the first stoppers 1411 and the second stoppers 1421 can be a cuboid, and a length extension direction of the cuboid is consistent with an arrangement direction of stoppers in a stopper group 14. As illustrated in FIG. 4, each of the first stoppers 1411 and the second stoppers 1421 can be a wavy solid, and a length extension direction of the wavy solid is consistent with an arrangement direction of the stoppers in the stopper group 14. In addition, each of the first stoppers 1411 and the second stoppers 1421 can also be of other shapes such as an arc-shaped solid, a cylinder, a circular truncated cone, a triangular prism, a cube or a polygonal solid, and is not limited to the structures illustrated in the accompanying drawings.

Figure 5:
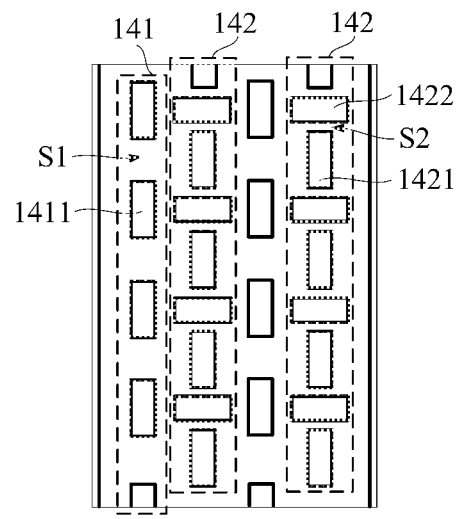
FIG. 5 is still another structural diagram of a crack stopping component of a flexible display substrate according to the embodiments of the disclosure.

As illustrated in FIG. 5, the second stopper group 142 further includes a fourth stopper 1422 in each second gap S2, and a length extension direction of each fourth stopper 1422 is perpendicular to a length extension direction of each second stopper 1421.

Figure 6:
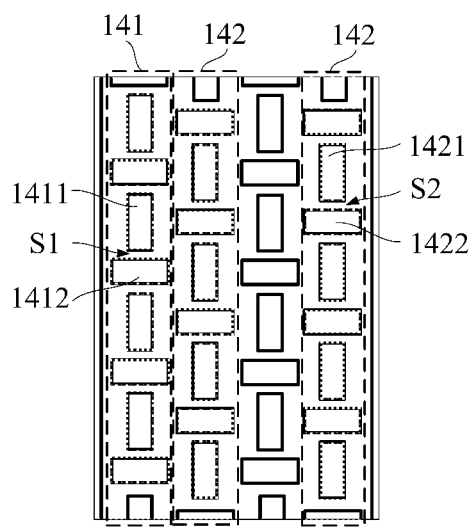
FIG. 6 is yet another structural diagram of a crack stopping component of a flexible display substrate according to the embodiments of the disclosure.

As illustrated in FIG. 6, the first stopper group 141 further includes a third stopper 1412 in each first gap S1, and a length extension direction of each third stopper 1412 is perpendicular to a length extension direction of each first stopper 1411; the second stopper group 142 further includes a fourth stopper 1422 in each second gap S2, and a length extension direction of each fourth stopper 1422 is perpendicular to a length extension direction of each second stopper 1421.

Since the length extension direction of each third stopper 1412 in the first stopper group 141 is perpendicular to the length extension direction of each first stopper 1411, and the length extension direction of each fourth stopper 1422 in the second stopper group 142 is perpendicular to the length extension direction of each second stopper 1421, an edge portion of the flexible display substrate 1 may further be structurally strengthened in different directions through the first stoppers 1411, the third stoppers 1412, the second stoppers 1421 and the fourth stoppers 1422, to make it impossible for the crack produced in the edge portion to pass through the crack stopping component to thereby protect the display area of the flexible display substrate and facilitate stress dispersion when the flexible display substrate 1 is bent in each direction.

Figure 7:
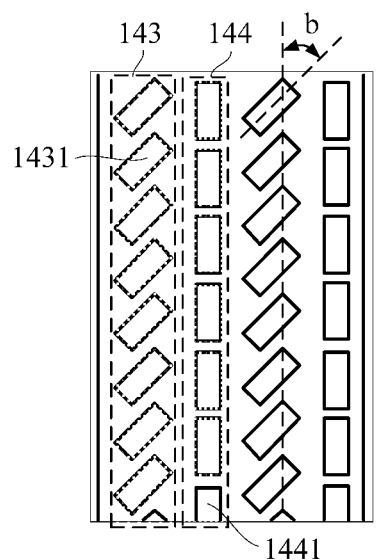
FIG. 7 is a further structural diagram of a crack stopping component of a flexible display substrate according to the embodiments of the disclosure.
Figure 8:
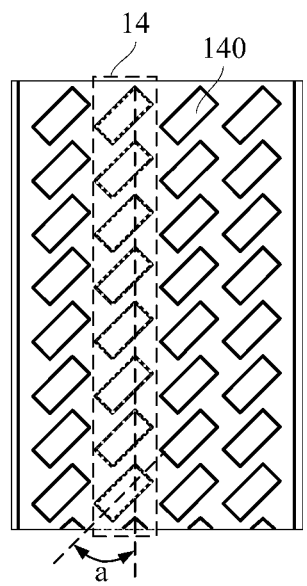
FIG. 8 is a further structural diagram of a crack stopping component of a flexible display substrate according to the embodiments of the disclosure.
Figure 9:
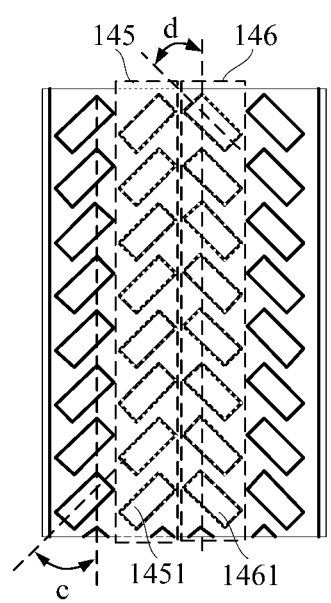
FIG. 9 is a further structural diagram of a crack stopping component of a flexible display substrate according to the embodiments of the disclosure.

In a particular implementation, as illustrated in FIG. 7 to FIG. 9, a length extension direction of each stopper in a stopper group 14 can have an included angle with an arrangement direction of the plurality of stoppers in the stopper group 14. That is, the stoppers can be arranged inclined to the arrangement direction thereof.

As illustrated in FIG. 8, a length extension direction of each stopper 140 in each stopper group 14 has an included angle a with the arrangement direction of the plurality of stoppers 140 in the stopper group 14.

As illustrated in FIG. 7, every two adjacent stopper groups 14 in at least two stopper groups 14 include a third stopper group 143 and a fourth stopper group 144; the third stopper group 143 includes a plurality of fifth stoppers 1431, and a length extension direction of each fifth stopper 1431 has an included angle b with an arrangement direction of the plurality of fifth stoppers 1431; and the fourth stopper group 144 includes a plurality of sixth stoppers 1441, and a length extension direction of each sixth stopper 1441 is consistent with an arrangement direction of the plurality of sixth stoppers 1441.

Similarly, as illustrated in FIG. 9, the plurality of stopper groups 14 include a fifth stopper group 145 and a sixth stopper group 146. A length extension direction of each stopper 1451 in the fifth stopper group 145 has a first included angle c with an arrangement direction of a plurality of stoppers 1451, and a length extension direction of each stopper 1461 in the sixth stopper group 146 has a second included angle d with an arrangement direction of a plurality of stoppers 1461. Where the first included angle c and the second included angle d can be identical or different, and can be set according to a practical situation. Where the first included angle c and the second included angle d can be 0~180°.

Further, when the crack stopping component includes a plurality of stopper groups 14, an arrangement structure of each stopper group 14 can be identical or different, and is not limited to the structures as illustrated in FIG. 2 to FIG. 9, and other arrangement structures can also be adopted.

On the basis of the above embodiments, each stopper in a stopper group 14 can be a stopper 140 made of a metal material. For example, the stopper can be fabricated on the same layer as a gate metal layer, and/or, a source and drain metal layer. Further, each insulation layer can include a buffer layer 121, a gate insulation layer, or a source and drain insulation layer 124; and the crack stopping component can be on the buffer layer 121, the gate insulation layer, or the source and drain insulation layer 124. Particularly, the crack stopping component can include a stopper group 14 fabricated on the same layer as the gate metal layer and a stopper group 14 fabricated on the same layer as the source and drain metal layer. Moreover, the plurality of stopper groups 14 in the crack stopping component can be on one layer, two layers or even more layers of the buffer layer 121, the gate insulation layer, and the source and drain insulation layer 124, respectively.

As illustrated in FIG. 1 and FIG. 2, in order to better stop the crack in the edge of the flexible display substrate 1 from extending to the display area, the flexible display substrate 1 further includes at least one annular blocking wall 15 on a side of the crack stopping component away from the display area, and/or, at least one blocking dam 16 on a side of the crack stopping component facing the display area. Where the flexible display substrate 1 can be provided with two annular blocking walls 15, or more than two annular blocking walls 15, and the annular blocking walls 15 are arranged at intervals. Further, each annular blocking wall 15 can be fabricated on the same layer as the gate insulation layer, and/or, the source and drain insulation layer 124. Each blocking dam 16 can be annularly arranged in a manner surrounding the display area; and when the organic layers (not illustrated in the figures) in the encapsulation layer 13 are formed by inkjet printing, the blocking dam 16 can prevent overflow of an organic material.

In addition, the embodiments of the disclosure further provide a display panel, which includes the flexible display substrate 1 according to any one of the above embodiments of the disclosure.

Moreover, the embodiments of the disclosure further provide a display device, which includes the display panel above according to the embodiments of the disclosure. Where the display device can be electronic equipment with a display function, for example, a mobile phone, an electronic book, a tablet computer, a television and a display.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. A flexible display substrate, comprising:
a flexible substrate;
a crack stopping component;
at least one annular blocking wall on the flexible substrate; and
an insulation layer on the flexible substrate;
wherein the flexible substrate comprises a display area, a non-display area surrounding the display area and a blocking wall area surrounding the non-display area;
wherein the at least one annular blocking wall is in the blocking wall area;
wherein the crack stopping component is on the insulation layer in the non-display area, and configured to stop a crack in the non-display area from extending to the display area;
wherein the flexible display substrate further comprises at least one blocking dam on a side of the crack stopping component proximate to the display area.

2. The flexible display substrate according to claim 1, wherein the crack stopping component comprises at least one stopper group; and each of the at least one stopper group comprises a plurality of stoppers distributed at intervals along a circumferential direction of the display area.

3. The flexible display substrate according to claim 2, wherein the crack stopping component is on at least one side of the display area.

4. The flexible display substrate according to claim 2, wherein when the crack stopping component comprises at least two stopper groups, the at least two stopper groups are arranged in parallel along a direction from the display area to the non-display area.

5. The flexible display substrate according to claim 4, wherein every two adjacent stopper groups in the at least two stopper groups comprise a first stopper group and a second stopper group;
the first stopper group comprises a plurality of first stoppers, and a first gap exists between every two adjacent first stoppers;
the second stopper group comprises a plurality of second stoppers, and a second gap exists between every two adjacent second stoppers; and
the first gap and the second gap are arranged in a staggered manner.

6. The flexible display substrate according to claim 5, wherein each of the first stoppers and the second stoppers is a cuboid or a wavy solid, and a length extension direction of the cuboid or the wavy solid is consistent with an arrangement direction of the first stoppers.

7. The flexible display substrate according to claim 6, wherein the first stopper group further comprises a third stopper in the first gap, and a length extension direction of the third stopper is perpendicular to a length extension direction of the first stoppers.

8. The flexible display substrate according to claim 7, wherein the second stopper group further comprises a fourth stopper in the second gap, and a length extension direction of the fourth stopper is perpendicular to a length extension direction of the second stoppers.

9. The flexible display substrate according to claim 4, wherein a length extension direction of each stopper in each stopper group has an included angle with an arrangement direction of the plurality of stoppers in the stopper group.

10. The flexible display substrate according to claim 4, wherein every two adjacent stopper groups in the at least two stopper groups comprise a third stopper group and a fourth stopper group;
the third stopper group comprises a plurality of fifth stoppers, and a length extension direction of each fifth stopper has an included angle with an arrangement direction of the plurality of fifth stoppers; and
the fourth stopper group comprises a plurality of sixth stoppers, and a length extension direction of each sixth stopper coincides with an arrangement direction of the plurality of sixth stoppers.

11. The flexible display substrate according to claim 2, wherein the crack stopping component comprises at least two stopper groups.

12. The flexible display substrate according to claim 1, wherein the insulation layer comprises a buffer layer, a gate insulation layer, or, a source and drain insulation layer.

13. A display panel, comprising a flexible display substrate, wherein the flexible display substrate comprises:
a flexible substrate;
a crack stopping component;
at least one annular blocking wall on the flexible substrate; and
an insulation layer on the flexible substrate;
wherein the flexible substrate comprises a display area, a non-display area surrounding the display area and a blocking wall area surrounding the non-display area; wherein the at least one annular blocking wall is in the blocking wall area;
wherein the crack stopping component is on the insulation layer in the non-display area, and configured to stop a crack in the non-display area from extending to the display area;
wherein the flexible display substrate further comprises at least one blocking dam on a side of the crack stopping component proximate to the display area.

14. A display device, comprising the display panel according to claim 13.

15. The display panel according to claim 13, wherein the crack stopping component comprises at least one stopper group; and each of the at least one stopper group comprises a plurality of stoppers distributed at intervals along a circumferential direction of the display area.

16. The display panel according to claim 15, wherein when the crack stopping component comprises at least two stopper groups, the at least two stopper groups are arranged in parallel along a direction from the display area to the non-display area.

17. The display panel according to claim 16, wherein every two adjacent stopper groups in the at least two stopper groups comprise a first stopper group and a second stopper group;
the first stopper group comprises a plurality of first stoppers, and a first gap exists between every two adjacent first stoppers;
the second stopper group comprises a plurality of second stoppers, and a second gap exists between every two adjacent second stoppers; and
the first gap and the second gap are arranged in a staggered manner.

18. The display panel according to claim 16, wherein a length extension direction of each stopper in each stopper group has an included angle with an arrangement direction of the plurality of stoppers in the stopper group.

19. The display panel according to claim 16, wherein every two adjacent stopper groups in the at least two stopper groups comprise a third stopper group and a fourth stopper group;
the third stopper group comprises a plurality of fifth stoppers, and a length extension direction of each fifth stopper has an included angle with an arrangement direction of the plurality of fifth stoppers; and
the fourth stopper group comprises a plurality of sixth stoppers, and a length extension direction of each sixth stopper coincides with an arrangement direction of the plurality of sixth stoppers.

* * * * *

UNITED STATES PATENT AND TRADEMARK OFFICE
CERTIFICATE OF CORRECTION

| | |
|---|---|
| PATENT NO. | : 11,316,128 B2 |
| APPLICATION NO. | : 16/337595 |
| DATED | : April 26, 2022 |
| INVENTOR(S) | : Ge Wang et al. |

It is certified that error appears in the above-identified patent and that said Letters Patent is hereby corrected as shown below:

On the Title Page

Item (71), please correct the first Applicant's address to read -- Chengdu. Sichuan (CN) --.

Item (73), please correct the first Assignee's address to read -- Chengdu, Sichuan (CN) --.

Signed and Sealed this
Eighteenth Day of October, 2022

Katherine Kelly Vidal
*Director of the United States Patent and Trademark Office*